United States Patent
Otsuka et al.

(10) Patent No.: US 9,054,315 B2
(45) Date of Patent: Jun. 9, 2015

(54) METHOD FOR MANUFACTURING ORGANIC LIGHT-EMITTING DEVICE

(75) Inventors: Manabu Otsuka, Narashino (JP); Tomoyuki Hiroki, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 13/619,390

(22) Filed: Sep. 14, 2012

(65) Prior Publication Data

US 2013/0084667 A1    Apr. 4, 2013

(30) Foreign Application Priority Data

Sep. 30, 2011   (JP) .................................. 2011-217662
Aug. 31, 2012   (JP) .................................. 2012-191771

(51) Int. Cl.
| | |
|---|---|
| H01L 21/00 | (2006.01) |
| H01L 51/00 | (2006.01) |
| H01L 51/56 | (2006.01) |
| H01L 27/32 | (2006.01) |

(52) U.S. Cl.
CPC ............ *H01L 51/0018* (2013.01); *H01L 51/56* (2013.01); *H01L 27/3211* (2013.01)

(58) Field of Classification Search
USPC .......... 438/82, 99, 780, 781, 789; 257/40, 60, 257/642, E25.008, E21.024, E21.242, 257/E21.299
See application file for complete search history.

(56) References Cited

U.S. PATENT DOCUMENTS

| | | | | |
|---|---|---|---|---|
| 2007/0132368 | A1* | 6/2007 | Kuwahara et al. | 313/503 |
| 2008/0096129 | A1* | 4/2008 | Itoh et al. | 430/270.1 |
| 2010/0295052 | A1* | 11/2010 | Yamazaki et al. | 257/60 |

FOREIGN PATENT DOCUMENTS

| | | |
|---|---|---|
| CN | 101599534 A | 12/2009 |
| JP | 3839276 B2 | 11/2006 |

* cited by examiner

*Primary Examiner* — Su C Kim
(74) *Attorney, Agent, or Firm* — Canon U.S.A. Inc., IP Division

(57) ABSTRACT

A method for manufacturing a light-emitting device includes a step of forming an etching resistant protection layer on a substrate provided with an organic planarizing layer, a step of forming a plurality of electrodes on the etching resistant protection layer, a step of forming an organic compound layer on the substrate provided with the plurality of electrodes, a step of forming a resist layer on the organic compound layer formed on parts of electrodes among the plurality of electrodes using a photolithographic method, and a step of removing the organic compound layer in a region not covered with the resist layer by dry etching, wherein an entire surface of the organic planarizing layer on the substrate on which steps up to the step of forming the plurality of electrodes have been performed is covered with at least one of the etching resistant protection layer and the electrode.

11 Claims, 9 Drawing Sheets

METHOD FOR MANUFACTURING ORGANIC LIGHT-EMITTING DEVICE

BACKGROUND OF THE INVENTION

1. Field of the Invention

The present invention relates to a method for manufacturing an organic light-emitting device.

2. Description of the Related Art

A multicolor organic light-emitting device is a light emitting device made by combining a plurality of organic light-emitting elements having different emission colors. Here when the multicolor organic light-emitting device is manufactured, it is necessary to selectively form a plurality of light-emitting layers having different emission colors in a predetermined region. Various methods have been used in order to selectively form the light-emitting layer emitting such a predetermined color in the predetermined region, and a method of patterning the light-emitting layers using a photolithographic method is available as one of such methods.

In Japanese Patent No. 3839276, a method has been proposed in which an organic compound layer is dry-etched to partially remove the organic compound layer to be unnecessary when the organic compound layer containing a light-emitting layer is patterned using the photolithographic method.

Specifically first, a film of a first organic compound layer is formed entirely on a substrate on which a first pixel electrode and a second pixel electrode have been formed in pattern. Subsequently, a portion where the first organic compound layer is formed is provided with a resist later that covers the first organic compound layer using the photolithographic method, and the first organic compound layer in a region not covered with the resist layer is selectively removed by dry etching. Subsequently, a film of a second organic compound layer is formed entirely, a portion where the first organic compound layer and the second organic compound layer are formed is provided with a resist layer by the photolithographic method, and the second organic compound layer in a region not covered with the resist layer is removed. Finally, layers formed on the resist layers are stripped using a resist stripper, and a common electrode is formed on the patterned first and second organic compound layers. By the above method, a light-emitting device provided with the plurality of organic light-emitting elements by patterning the plurality of organic compound layers is formed.

When the organic compound layer is patterned according to the method discussed in Japanese Patent No. 3839276, a substrate provided with a transistor (Tr) and a wiring layer for driving the organic light-emitting element is used in some cases. In such a case, before forming the pixel electrode and the like, it is necessary to form an organic planarizing layer that covers Tr and the wiring layer in order to smoothen and planarize roughness due to Tr and the wiring layer. If necessary in some cases, an organic pixel separation film that covers edges of the pixel electrode is formed on the organic planarizing film for the purpose of smoothening an unevenness produced depending on the film thickness of the pixel electrode as well as laying out a light-emitting region of each light-emitting element.

The organic planarizing film and the organic pixel separation film are members composed of the same organic material as in the organic compound layer. When the layer is patterned by the method discussed in Japanese Patent No. 3839276, the inconvenience described below may occur under a circumstance where the member composed of the organic material is exposed on a surface of the substrate.

A time period when dry etching is performed is adjusted not to leave a film of the organic compound layer on the electrode provided in the region where the dry etching is performed. Specifically, the time period required for removing the organic compound layer is calculated from the film thickness of the organic compound layer and an etching rate of the organic compound layer. The dry etching is performed for a longer time than the time period required for removing the organic compound layer.

The etching rate of the organic planarizing layer and the organic pixel separation layer is almost the same as the etching rate of the organic compound layer. Thus, after removing the organic compound layer by the etching, the organic planarizing layer and the organic pixel separation layer arranged between the first and second pixel electrodes and in a circumference of a display region are also etched similarly to the first organic compound layer. As a result, depressions occur in the organic planarizing layer and the organic pixel separation film provided in the region exposed to the etching, and an excessive unevenness occurs between the first organic compound layer and the organic planarizing layer or between the first organic compound layer and the pixel separation film. If this is the case, when the second organic compound layer or the film of the common electrode is formed, the second organic compound layer or the common electrode is sometimes partially broken or thinned due to this excessive unevenness. The broken part and the thinned part of the second organic compound layer and the common electrode cause a short circuit between the electrodes of the organic light-emitting elements and become a resistance in a current supply circuit to cause impaired properties in the organic light-emitting device.

In Japanese Patent No. 3839276, the substrate is washed with water after developing the resist layer in a step of patterning the organic compound layer using the photolithographic method. At that time, if the member composed of the organic material is exposed on the surface of the substrate, the water penetrates and is absorbed/stored in the organic planarizing layer and the organic pixel separation film. Thus, it takes a long time to dehydrate the member, and the residual water is leaked at the time of use of the light-emitting device to reduce the properties of the organic light-emitting element.

SUMMARY OF THE INVENTION

The present invention is directed to a method for manufacturing an organic light-emitting device for obtaining the organic light-emitting device having a good light-emitting property.

According to an aspect of the present invention, a method for manufacturing a light-emitting device including a plurality of organic light-emitting elements each including an organic compound layer including at least a light-emitting layer and an electrode that supplies a carrier to the organic compound layer on a substrate provided with an organic planarizing layer includes a step of forming an etching resistant protection layer on the substrate provided with the organic planarizing layer, a step of forming a plurality of electrodes on the etching resistant protection layer, a step of forming the organic compound layer on the substrate provided with the plurality of electrodes, a step of forming a resist layer on the organic compound layer formed on parts of electrodes among the plurality of electrodes using a photolithographic method, and a step of removing the organic compound layer in a region not covered with the resist layer by dry etching, wherein an entire surface of the organic planarizing layer on the substrate on which steps up to the step of forming the plurality of electrodes have been performed is covered with at least one of the etching resistant protection layer and the electrode.

In the method for manufacture according to an exemplary embodiment of the present invention, an unevenness in a region to be etched on the organic planarizing layer is reduced when patterning is carried out using the photolithographic method and the dry etching in the organic light-emitting device in which at least the organic planarizing layer is provided in an upper part of a transistor and a wiring. This enables reducing breaking of a common electrode and leakage/short circuit that may occur between the common electrode and a pixel electrode. Further, by covering the surface of the organic planarizing layer with at least one of the etching resistant protection layer or a lower electrode, it is possible to prevent water from penetrating into the organic planarizing layer when the organic compound layer is patterned by the photolithographic method. As a result, it can be prevented that water absorbed and stored in an organic planarizing film that easily absorbs and stores the water is leaked after completion of the elements and deteriorates the organic light-emitting elements.

Thus, according to an exemplary embodiment of the present invention, it is possible to provide the method for manufacturing the organic light-emitting device for obtaining the organic light-emitting device having the good light-emitting properties.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Figure 1A:
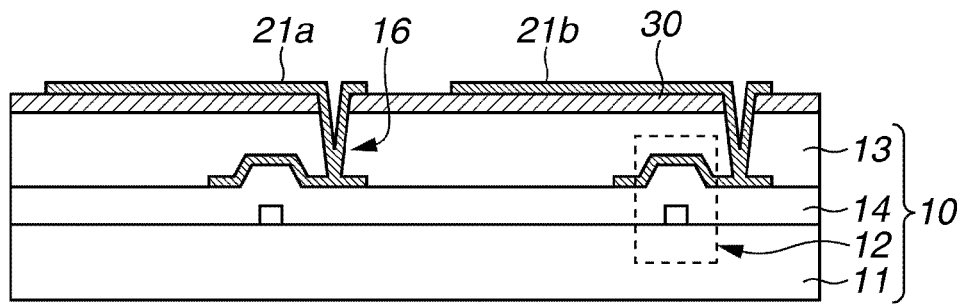
FIGS. 1A, 1B, and 1C are cross-sectional schematic views illustrating specific examples of steps of forming and processing a film of a first organic compound layer.

Various exemplary embodiments, features, and aspects of the invention will be described in detail below with reference to the drawings.

An exemplary embodiment of the present invention is a method for manufacturing an organic light-emitting device in which an organic planarizing layer, a plurality of first pixels, and a plurality of second pixels are provided on a substrate. Here, the first pixel includes a first organic light-emitting element composed of a first lower electrode, a first organic compound layer having at least a light-emitting layer, and a first upper electrode. The second pixel includes a second organic light-emitting element composed of a second lower electrode, a second organic compound layer having at least a light-emitting layer, and a second upper electrode. The first organic compound layer and the second organic compound layer are different from each other, and the organic compound layer in the present exemplary embodiment includes at least the light-emitting layer. More specifically, the organic compound layer in the present exemplary embodiment encompasses a case composed of one or a plurality of light-emitting layers or a case of composed of a laminated body of a plurality of layers further including one or more other layers composed of an electron injection layer, an electron transport layer, a hole injection layer, a hole transport layer, and the like in addition to such a light-emitting layer. The mutually "different organic compound layers" refer to the organic compound layers that are mutually different in at least one of a material, a composition, and a film thickness of the light-emitting layer, a film forming method and a film forming condition when the light-emitting layer is formed, a material, a composition, and a film thickness of the layer other than the light emitting layer, a film forming method and a film forming condition when the other layer is formed. Further in the present exemplary embodiment, the first upper electrode and the second upper electrode are a common electrode layer continuously provided over all of the pixels provided on the substrate, and refer to the same layer. The organic light-emitting device manufactured in the method for manufacture in the present exemplary embodiment is not limited to those including two types of the pixels.

The method for manufacture in the present exemplary embodiment is mainly utilized as the method for manufacturing the organic light-emitting device of top emission type, in which the light is taken from a common electrode side. However, the present invention is not limited thereto, and can also be utilized as the method for manufacturing the organic light-emitting device of bottom emission type.

The method for manufacturing the organic light-emitting device of the present exemplary embodiment includes at least the following steps (i) to (iv):
(i) a step of forming lower electrodes wherein a first lower electrode and a second lower electrode are formed,
(ii) a step of forming a first organic compound layer wherein the first organic compound layer is formed in such a way as to cover the first lower electrode and the second lower electrode,
(iii) a step of processing the first organic compound layer wherein the first organic compound layer formed on the second lower electrode is removed by dry etching, and
(iv) a step of forming a second organic compound layer wherein the second organic compound is formed after the step of processing the first organic compound layer.

Here, the present exemplary embodiment further includes a step of forming an etching resistant protection layer wherein the etching resistant protection layer is provided between the nearby lower electrodes before the step of forming the lower electrodes or between the step of forming the lower electrodes and the step of forming the first organic compound layer. More specifically, the present exemplary embodiment further includes the step of forming the etching resistant protection layer wherein the etching resistant protection layer is provided between the nearby lower electrodes before the step (i) or between the step (i) and the step (ii). In the present exemplary embodiment, the etching resistant protection layer is formed using a material, an etching rate of which is slower than an etching rate of the first organic compound layer in the step of processing the first organic compound layer.

Figure 1B:
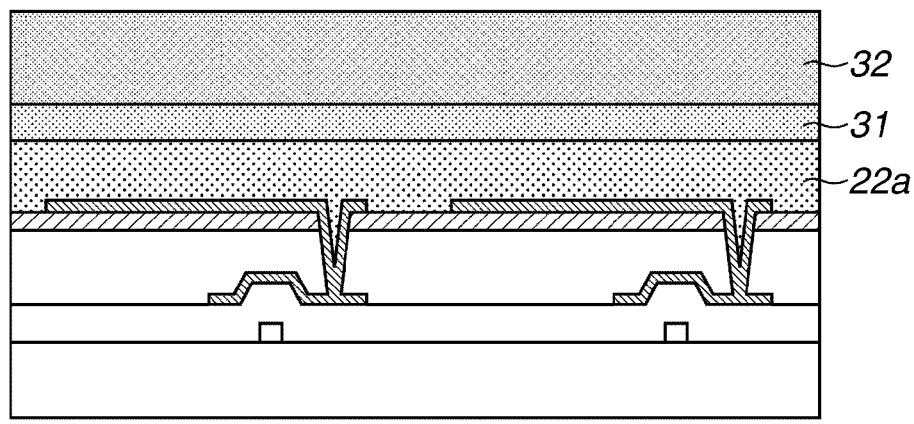
Figure 1C:
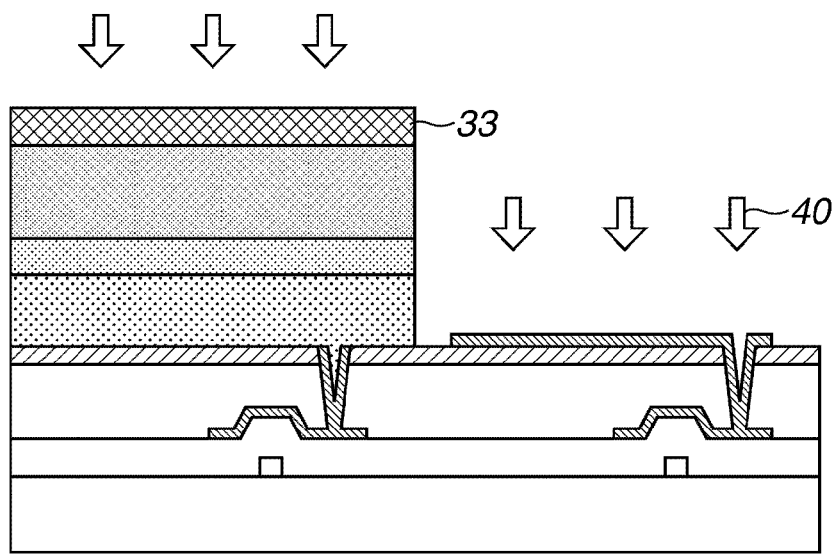
Figure 2A:
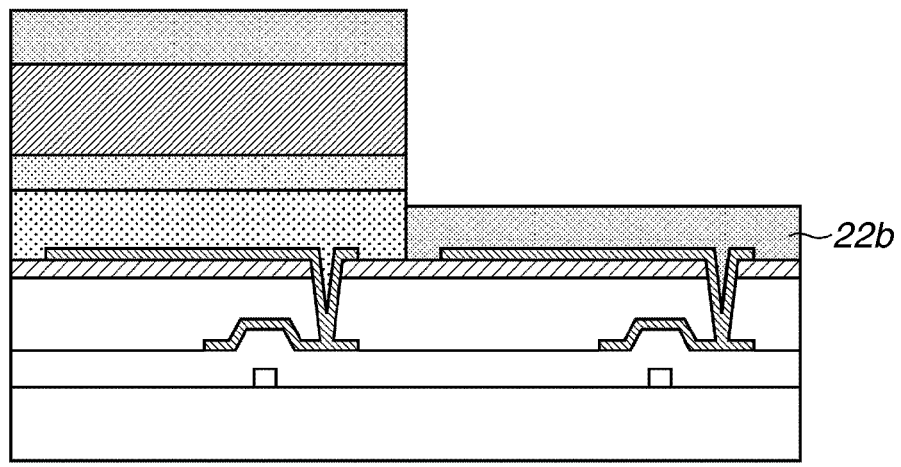
FIGS. 2A, 2B, and 2C are cross-sectional schematic views illustrating specific examples of steps of forming and processing a film of a second organic compound layer and a step of processing a common electrode.
Figure 2B:
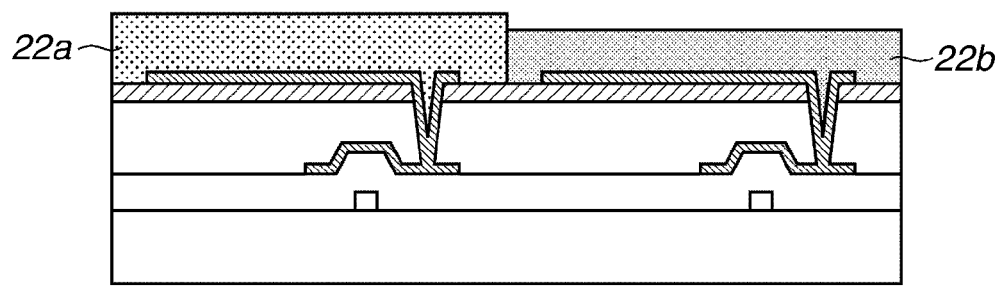
Figure 2C:
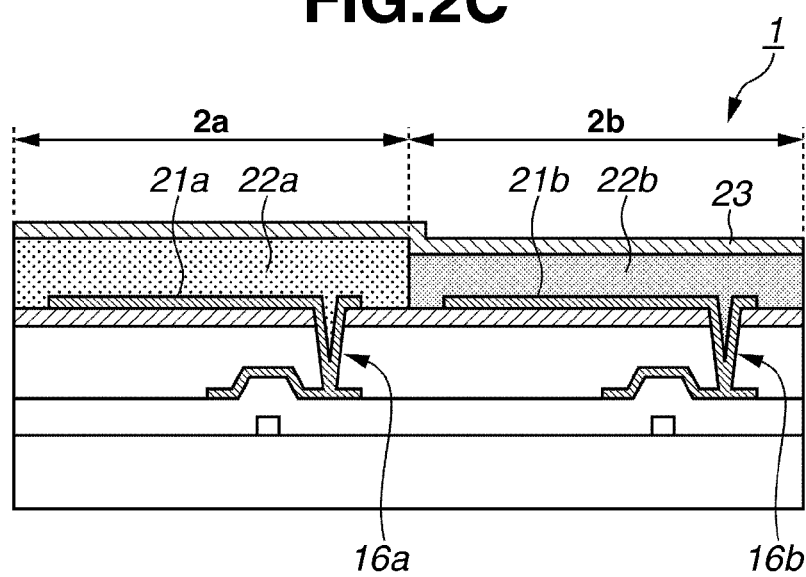

FIGS. 1A, 1B, and 1C are cross-sectional schematic views illustrating specific examples of steps of forming and processing the film of the first organic compound layer. FIGS. 2A, 2B, and 2C are cross-sectional schematic views illustrating specific examples of steps of forming and processing the film of the second organic compound layer and steps of processing the common electrode. FIGS. 1A, 1B, and 1C, and FIGS. 2A, 2B, and 2C illustrate a series of processes upon manufacturing the organic light-emitting device 1 having two types of pixels (first pixel 1a and second pixel 2b).

The method for manufacturing the organic light-emitting device in the present exemplary embodiment will be described below based on FIGS. 1A, 1B, and 1C, and FIGS. 2A, 2B, and 2C.

(Step of Making Substrate)

First, a substrate 10 having a pixel driving circuit (symbol 12 in FIG. 1A) is made (FIG. 1A). Specifically, the pixel driving circuit 12 including switching elements such as a transistor and a wiring (not shown in the figure) are formed on a base 11, and subsequently an organic planarizing layer 13 is formed in such a way as to cover the pixel driving circuit 12 and the wiring. An insulation layer 14 may appropriately be provided when the pixel driving circuit 12 and the wiring (not shown in the figure) are formed.

The substrate that includes the base 11 may be transparent or opaque. The substrate may also be an insulated substrate composed of glass or synthesized resin or a conductive substrate, on the surface of which an insulated film such as a silicon oxide ($SiO_2$) film, a silicon nitride (SiN) film, or a silicon nitride oxide (SiON) film is formed, or a semiconductor board such as Si wafer.

The transistor included in the pixel driving circuit 12 is not limited to polysilicon that is a semiconductor layer, and amorphous silicon and microcrystal silicon may also be used. Metal materials such as Al and Al alloys having a low electric resistance can be used for the wiring provided on the base 11.

The organic planarizing layer 13 is formed of an insulating material and has a function of planarizing the substrate 10. The organic planarizing layer 13 is advantageously formed of a material having a good pattern accuracy in order to open a fine opening such as a connecting hole that electrically connects the pixel driving circuit 12 to the lower electrode (first lower electrode 21a, second lower electrode 21b). Here, the constituent material that includes the organic planarizing layer 13 includes, for example, photosensitive polyimide and acrylic resins.

The insulation layer 14 is a layer formed of the insulating material such as silicon nitride and silicon oxide, but the insulating material used for forming the insulation layer 14 is not particularly limited.

(Step of Forming Etching Resistant Protection Layer)

In the present exemplary embodiment, the etching resistant protection layer 30 is formed before forming the lower electrodes (first lower electrode 21a, second lower electrode 21b) that compose the organic light-emitting element (FIG. 1A). In the present exemplary embodiment, the etching resistant protection layer 30 is formed before forming the lower electrodes, and the organic planarizing layer 13 is entirely covered with the etching resistant protection layer 30. Then, the lower electrodes (21a, 21b) are formed after forming the connecting hole to the pixel driving circuit 12 by patterning.

Figure 3A:
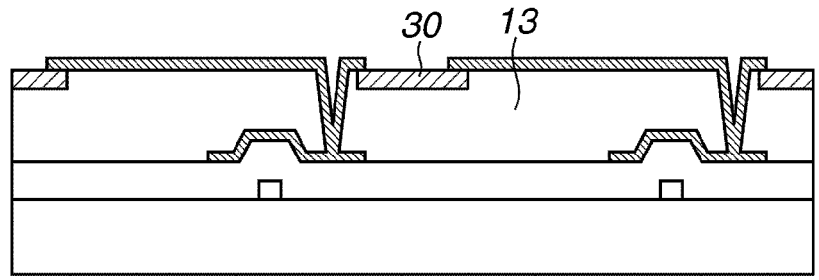
FIGS. 3A, 3B, 3C, and 3D are cross-sectional schematic views illustrating other specific examples of an aspect of placing an etching resistant protection layer.
Figure 6A:
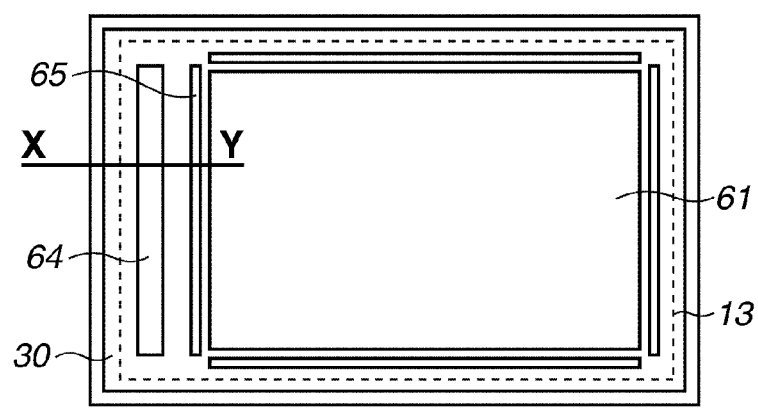
FIGS. 6A and 6B are cross-sectional schematic views illustrating specific examples of an aspect of placing an organic planarizing layer, an etching resistant protection layer, and a pixel electrode in Example 1.
Figure 6B:
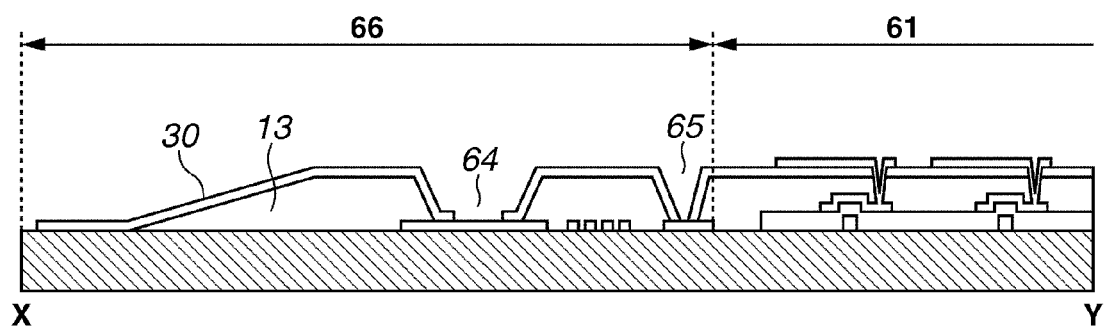

An aspect of forming the etching resistant protection layer 30 in a display region is not limited to an aspect illustrated in FIG. 1A, and it is only necessary to avoid contact of the surface of the organic planarizing layer 13 with water in a step of patterning the organic compound layer. For example, as illustrated in FIG. 3A described later, the etching resistant protection layer 30 may be formed to cover the organic planarizing layer 13 provided between the mutually nearby lower electrodes (21a, 21b) and to allow the organic planarizing layer 13 to be covered with at least either one of the lower electrode or the etching resistant protection layer. As also illustrated in FIGS. 6A and 6B, by covering the organic planarizing layer 13 up to its edges with the etching resistant protection layer 30 in not only an inside of the display region 61 but also an outside of the display region 66, it becomes possible to block the water from penetrating into the organic planarizing layer 13 when the organic compound layer is patterned using the photolithographic method. The etching resistant protection layer 30 is formed in a larger region than a region of the organic planarizing layer 13, and is brought into contact with an inorganic material film formed under the organic planarizing layer or the substrate to entirely cover the organic planarizing layer. In order to assure the electric connection, the etching resistant protection layer 30 is removed on a contact portion 65 in which the upper electrode is brought into contact with the circuit or the wiring and on a pad portion 64 in which an outer input wiring is connected.

When the organic planarizing layer 13 is covered with the etching resistant protection layer 30, it is advantageous to previously remove the water left in the organic planarizing layer 13 before forming the etching resistant protection layer 30. If the organic planarizing layer 13 with the residual water is covered with the etching resistant protection layer 30, the etching resistant protection layer 30 cracks in some cases due to heating when the film of the etching resistant layer is formed, heating in vacuum when the film of the organic compound layer is formed, heating during the step of patterning the organic compound layer by the photolithographic method, and heating in vacuum after the patterning. Thus, it is advantageous to heat the organic planarizing layer at higher temperature than heating temperature in the step after forming the organic planarizing layer to remove the water before forming the film of the etching resistant protection layer.

For example, when photosensitive polyimide is used for the organic planarizing layer 13, after heating at 200 to 300° C. for about 2 hours, the etching resistant protection layer 30 is formed in such a way as to cover the organic planarizing layer 13. Further, after forming a contact hole (connecting hole) with the pixel driving circuit 12 by patterning and before forming the lower electrodes (21a, 21b), the organic planarizing layer 13 may also be dehydrated by heating as needed.

The other aspect of forming the etching resistant protection layer 30 will be described below with appropriate reference to the drawings.

FIGS. 3A, 3B, 3C, and 3D are cross-sectional schematic views illustrating other specific examples of the aspect of placing the etching resistant protection layer. The display region alone in each aspect is illustrated in FIGS. 3A to 3D. Any of the organic planarizing film provided out of the display region is covered up to its edges with the etching resistant protection layer 30 as is the case with in FIGS. 6A and 6B.

The aspect in FIG. 3A is one of specific examples when the etching resistant protection layer 30 is formed before forming the lower electrodes (21a, 21b) as is the case with FIG. 1A. As already described, when the etching resistant protection layer 30 is formed before forming the lower electrodes (21a, 21b)

in the present exemplary embodiment, the etching resistant protection layer 30 is formed in such a way as to cover the organic planarizing layer 13 provided between at least mutually nearby lower electrodes (21a, 21b) as illustrated in FIG. 3A, and the organic planarizing layer 13 is covered with at least the etching resistant protection layer 30 or the lower electrodes.

Figure 3B:
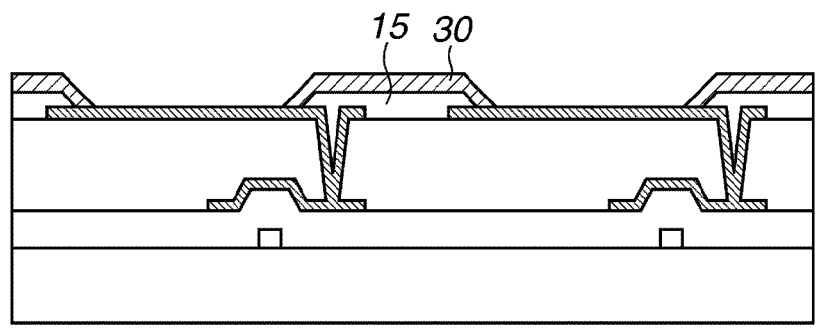

The aspect in FIG. 3B is one of specific examples when an organic pixel separation film 15 is provided between the mutually nearby lower electrodes (21a, 21b). As illustrated in FIG. 3B, when the organic pixel separation film 15 composed of an organic material such as photosensitive polyimide is provided on the substrate 10, the etching resistant protection layer 30 is formed in such a way as to cover the organic pixel separation film 15. More specifically, in the aspect in FIG. 3B, the step of forming the etching resistant protection layer 30 is carried out after the step of forming the lower electrodes (21a, 21b) and the step of forming the organic pixel separation film 15 and before the step of forming the first organic compound layer described later. Also in the case of FIG. 3B, the step of patterning the organic pixel separation film 15 and providing an opening on the lower electrodes (21a, 21b), the step of forming the etching resistant protection layer 30, and the step of providing an opening in the etching resistant protection layer in line with the opening in the organic pixel separation film 15 are carried out sequentially. By this, the etching resistant protection layer 30 is formed at least on the organic pixel separation film (on the organic pixel separation film 15), and the organic planarizing film 13 and the organic pixel separation film 15 are covered at least with the etching resistant protection layer 30 or the lower electrodes. When the organic pixel separation film 15 is formed, the circuit and the wiring provided out of the display region may be covered with the organic pixel separation film 15 in place of the organic planarizing film 13. In such a case, the etching resistant protection layer 30 is formed also in the outer than the edges of the organic pixel separation film 15, and covers the organic pixel separation film 15 to its edges.

Figure 3C:
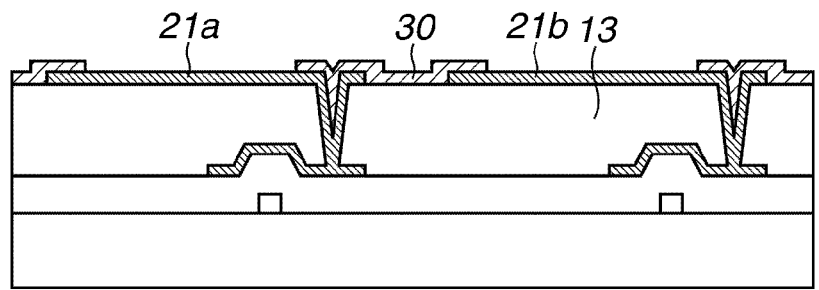
Figure 3D:
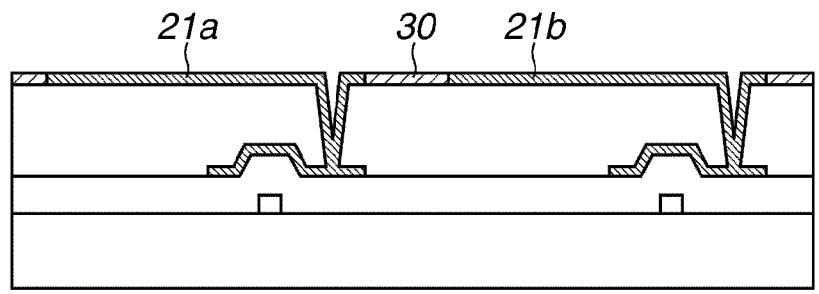

The aspect in FIG. 3C is one of specific examples when the etching resistant protection layer 30 is formed after forming the lower electrodes (21a, 21b). The aspect in FIG. 3C is common to the aspect in FIG. 3B in that the etching resistant protection layer 30 is formed after forming the lower electrodes (21a, 21b), but different in whether the organic pixel separation film 15 is formed or not before forming the etching resistant protection layer 30. In the present exemplary embodiment, the etching resistant protection layer 30 may be formed in such a way as to cover the edges of the lower electrodes (21a, 21b) and the organic planarizing layer 13 provided between the mutually nearby lower electrodes without previously forming the organic pixel separation film 15 as the aspect in FIG. 3C. However, in the present exemplary embodiment, there is no need to cover the edges of the lower electrode (21a, 21b), and for example as illustrated in FIG. 3D, the etching resistant protection layer 30 may be formed so as to cover the organic planarizing layer 13 alone provided between the lower electrodes.

The dry etching using an etching gas composed mainly of oxygen is used for the etching conducted in the step of processing the first organic compound layer described below. A material, the etching rate of which is smaller than a constituent material of the first organic compound layer etched in the step of processing the first organic compound layer is used as a constituent material of the etching resistant protection layer 30. There is no need that the etching resistant protection layer 30 is a layer composed of a single material. The etching resistant protection layer 30 may be a layer made by mixing a plurality of materials in plane or a laminated body composed of a plurality of layers.

When the organic light-emitting device is made using the photolithographic method, water sometimes penetrates into the organic planarizing layer 13. Here, if the water penetrated into the organic planarizing layer 13 due to the photolithographic method is left, the water causes a light-emitting unevenness, property deterioration, and peripheral brightness deterioration in some cases when the organic light-emitting device is made.

Thus, the etching resistant protection layer 30 serves as a layer for blocking the penetration of water into the organic planarizing layer 13. Specifically, when the photolithographic method is applied, if the organic planarizing layer 13 is at least partially exposed, the exposed portion easily absorbs the water. Thus, in the present exemplary embodiment, the organic planarizing layer 13 within the display region is covered at least with the etching resistant protection layer 30 or the lower electrodes (21a, 21b). Further, out of the display region, the etching resistant protection layer 30 is formed in the outer than the region of the organic planarizing layer 13, and is brought into contact with a cathode contact region under the organic planarizing film 13 or the inorganic material film formed in the pad portion, or with the substrate as illustrated in FIGS. 6A and 6B. As a result, the organic planarizing layer 13 is entirely covered with at least either one of the etching resistant protection layer 30 or the lower electrodes (21a, 21b). In the case of having the pixel separation film 15, the pixel separation film 15 may also be covered with the etching resistant protection layer 30 as illustrated in FIG. 3B.

Here, in order to allow the etching resistant protection layer 30 to work as the layer that blocks the penetration of water, an inorganic material is advantageously used as the constituent material for the etching resistant protection layer 30. This inorganic material specifically includes insulating inorganic materials such as silicon nitride (SiN) and oxygen nitride (SiO), and laminated bodies composed of an insulation layer provided on the lower electrodes (21a, 21b) and a metal such as Al.

However, the constituent material for the etching resistant protection layer 30 is not limited to the inorganic materials, and may also be organic materials having a low water permeability. For example, the organic planarizing film 13 and the organic pixel separation film 15 are formed of a polymer material such as photosensitive polyimide having the low water permeability, and a plasma treatment using Ne/Ar is performed on their surface to form a surface crosslinking layer, which can also be used as the etching resistant protection layer 30.

In addition to the above conditions, the material, the etching rate of which is smaller than that of the constituent material for the first organic compound layer 22a formed in the later step is selected as the constituent material for the etching resistant protection layer 30.

(Step of Forming Lower Electrodes)

Although depending on the exemplary embodiments, the method for manufacturing the organic light-emitting device in the present exemplary embodiment forms the lower electrodes (21a, 21b) on the substrate 10 before forming the etching resistant protection layer 30 or after forming the etching resistant protection layer 30 (FIG. 1A). The case of manufacturing the organic light-emitting device of top emission type will be described below, but the application of the present invention is not limited to the organic light-emitting device of top emission type.

The lower electrodes (21a, 21b) can be formed of a material allowing a carrier to be supplied to the organic compound layer. When the organic light-emitting device of top emission type is made, the lower electrodes (21a, 21b) are formed of a metal material such as Al, Ag, Au, Pt, and Cr having a high light reflectivity or a light reflective material such as an alloy combining a plurality of kinds of these metal materials. A laminated electrode laminating a transparent electrode of indium tin oxide or indium zinc oxide on a layer containing these metal materials may also be employed. These lower electrodes together with the etching resistant protection layer block the penetration of water into the organic planarizing layer 13 when the organic compound layer is patterned by the photolithographic method. Thus, the film thickness of the metal material can also be thickened to several hundreds nm as needed.

The lower electrodes (21a, 21b) are electrodes provided individually per pixel. Here, when the lower electrodes (21a, 21b) are formed, a thin film composed of the aforementioned electrode material is formed, and subsequently is patterned into a desired shape to form the lower electrodes (21a, 21b). When the thin film composed of the electrode material is patterned, known methods for forming the pattern can be used.

(Step of Forming Organic Pixel Separation Film)

The step of forming the organic pixel separation film 15 may be conducted after forming the lower electrodes (21a, 21b) and if necessary before conducting the step of forming the first organic compound layer. Here, when the organic pixel separation film 15 is formed, in order to protect the organic pixel separation film 15 from the dry etching, it is advantageous to conduct the step of forming the etching resistant protection layer 30 after the step of forming the organic pixel separation film 15. The organic pixel separation film 15 formed in the step of forming the organic pixel separation film 15 is a member that covers respective edges of the first lower electrode 21a and the second lower electrode 21b. The etching resistant protection layer 30 formed in the step of forming the etching resistant protection layer is advantageously formed at least on the organic pixel separation film 15.

When the organic pixel separation film 15 is formed, the constituent material for the organic pixel separation film 15 is not particularly limited as long as it is an organic material. The constituent material for the organic planarizing layer 13 may be used as the constituent material for the organic pixel separation film 15.

(Step of Forming First Organic Compound Layer)

After forming the lower electrodes (21a, 21b), a first organic compound layer 22a is formed over the entire surface of the display region included in the organic light-emitting device (FIG. 1B).

The first organic compound layer 22a is a monolayer or a laminated body composed of a plurality of layers having at least the light-emitting layer. Here when the first organic compound layer 22a is composed of the plurality of layers, any of functional layers such as a hole injection layer, a hole transport layer, a hole block layer, an electron block layer, an electron transport layer, and an electron injection layer in addition to the light-emitting layer is included in the first organic compound layer 22a.

A constituent aspect of the first organic compound layer 22a includes, for example, (cathode/)electron transport layer/light-emitting layer/hole transport layer/hole injection layer (/anode), but the present invention is not limited thereto.

The film thickness of the first organic compound layer 22a is not particularly limited, and is advantageously several tens nm to several hundreds nm. The film thickness of the organic compound layer including the first organic compound layer 22a can be determined, for example, by an optical interference distance. Here when the film thickness of the organic compound layer is determined by the optical interference distance, the optical interference distance is different in each emission color, and thus the film thickness of the organic compound layer is different in each emission color depending on this optical interference distance.

Low molecular materials and polymer materials can be used for materials for the light-emitting layer included in the first organic compound layer 22a. A film of each layer that composes the first organic compound 22a can be formed by selecting a known method such as an applying method by a method of vacuum deposition, a spin coating method, and an inkjet method, depending on its material and intended use.

Here, triarylamine derivatives, stilbene derivatives, polyarylene, aromatic fused polycyclic compounds, aromatic heterocyclic compounds, aromatic heterocyclic fused cyclic compounds, metal complex compounds, and mono-oligomers and multi-oligomers thereof can be used as the low molecular materials that are the constituent materials for the light-emitting layer. However, the present invention is not limited thereto.

Also, polyparaphenylene vinylene derivatives, polythiophene derivatives, polyparaphenylene derivatives, polysilane derivatives, polyacetylene derivatives, polyfluorene derivatives, polyvinyl carbazole derivatives, and those obtained by polymerizing the above low molecular materials can be used as the polymer-based materials that are the constituent materials for the light-emitting layer. However, the present invention is not limited thereto.

Further when the layers other than the light-emitting layer, for example, the hole injection layer, the hole transport layer, the electron block layer, and the like are included in the first organic compound layer 22a, known materials for hole injection/transport can be used as the constituent materials for these layers. Also when the layers other than the light-emitting layer, for example, the electron injection layer, the electron transport layer, the hole block layer, and the like are included in the first organic compound layer 22a, known materials for electron injection/transport can be used as the constituent materials for these layers.

(Step of Processing First Organic Compound Layer)

The first organic compound layer 22a is processed by performing a predetermined patterning after forming the first organic compound layer 22a as described above (FIGS. 1B to 1C). Specifically, the first organic compound layer 22a formed on the second lower electrode 21b in the previous step of forming the first organic compound layer 22a is removed. Here, the step of processing the first organic compound layer is advantageously conducted according to the following steps (1a) to (1h), but the present invention is not limited to the process described in the following steps (1a) to (1h).

(1a) A step of forming a release layer wherein a water-soluble release layer is formed on the first organic compound layer, (1b) a step of forming a protection layer wherein the protection layer composed of an inorganic material is formed on the release layer, (1c) a step of forming a resist layer wherein a film of a resist material is formed on the protection layer, (1d) a step of processing the resist layer wherein the resist layer is patterned, (1e) a step of removing the protection layer, the release layer, and the first organic compound layer provided at least on the second lower electrode by dry etching, (1f) a step of removing the protection layer provided at least on the second lower electrode by the dry etching, (1g) a step of removing the release layer provided at least on the second lower electrode by the dry etching, and (1h) a step of removing the first organic compound layer provided at least on the second lower electrode by the dry etching.

Here, the first organic compound layer 22a is processed (patterned) by using a photolithographic step and a dry etching step in combination.

First, known steps such as exposure devices such as mirror projection mask aligner (MPA) and stepper can be used in the photolithographic step.

Here, when the first organic compound layer 22a is patterned, if the first organic compound layer 22a is insoluble in a solution containing the resist material, the solution containing the resist material may be applied directly onto the first organic compound layer 22a, which may be patterned.

On the other hand, if the first organic compound layer 22a is soluble in the solution containing the resist material, a layer that protects the first organic compound layer 22a is provided before applying the solution containing the resist material onto the first organic compound layer 22a. For example, as illustrated in FIG. 1B, a release layer 31 and a resist resistant protection layer 32 are sequentially provided on the first organic compound layer 22a to protect the first organic compound layer 22a from the solution containing the resist material. The release layer 31 is a layer provided for effectively removing the protection layer 32 after completing the processing of the first organic compound layer 22a. The constituent material for the release layer 31 is selectively soluble in a certain solvent in contrast to the constituent material for the first organic compound layer 22a. In other words, the first organic compound layer 22a is scarcely dissolved in the solvent used for removing the release layer 31. Here, for example a water-soluble polymer material can be used as the constituent material for the release layer 31. Also, known materials such as polyvinyl alcohol (PVA), polyacrylic acid-based polymers, polyethylene glycol (PEG), polyethylene oxide (PEO), and polyvinyl pyrrolidone (PVP) can be used as specific examples of the water-soluble polymer materials used as the constituent material for the release layer 31.

The constituent material for the protection layer 32 includes inorganic materials. Materials that can protect the release layer 31 and the first organic compound layer 22a from a wet step such as a photolithographic step using the resist material are advantageous among the inorganic materials that can be the constituent material for the protection layer 32. Known inorganic materials such as a silicon oxide ($SiO_2$) film, a silicon nitride (SiN) film, and a silicon oxide nitride (SiON) film can be used as the materials that satisfy the above, but the present invention is not limited thereto. The film of the protection layer 32 can be formed using a known method such as an application method or a printing method.

After forming the protection layer 32, the solution containing the resist material is applied onto the protection layer 32 to form a resist layer 33. Exposure and development are carried out in such a way as to leave the resist layer 33 formed in a region in which the first organic compound layer is formed, i.e., a first pixel is provided, and subsequently patterning by the dry etching using an etching gas 40 is carried out (FIG. 1C).

Here, when the patterning by the dry etching is performed, the resist layer 33 left as illustrated in FIG. 1C is used as a mask, and the protection layer 32, the release layer 31, and the first organic compound layer 22a provided on the second lower electrode 21b are removed in this order.

A method conducted by chemical etching and a method conducted by physical etching are utilized for the dry etching. Here, the chemical etching refers to a method of etching using chemical reactivity of the etching gas such as oxygen or fluorine-based gas such as $CF_4$ for a film material formed on the substrate. The physical etching refers to a method of etching using physical property by allowing molecules of gas such as argon gas to collide with the film material formed on the substrate.

In the present exemplary embodiment, it is advantageous to conduct the chemical etching using the oxygen gas as the etching gas when the first organic compound layer 22a is etched. However if necessary, the gas other than the oxygen gas, for example, argon or fluorine-based gas may be mixed in the etching gas in order to enhance selectivity of etching for the etching resistance protection layer 30.

When the first organic compound layer 22a is etched, it is necessary to completely remove the first organic compound layer 22a formed on the second lower electrode 21b. However, the film of the first organic compound layer 22a is partially left on the second lower electrode 21b in some cases due to a film thickness unevenness of the first organic compound layer 22a and etching unevenness in the processing of the first organic compound layer 22a. If the film of the first organic compound layer 22a is partially left on the second lower electrode 21b, injection failure is caused when the electron is injected from the second lower electrode 21b, and the light-emitting unevenness is caused when a second organic compound layer 22b is formed.

Thus, when the dry etching is performed to the first organic compound layer 22a, it is necessary that an etching time for the first organic compound layer 22a is estimated to be significantly longer than an etching time calculated from the film thickness and the etching rate of the formed first organic compound layer 22a. Specifically, it is advantageous to estimate the etching time for over-etching up to additional 10 to 30% film thickness with respect to the film thickness of the first organic compound layer 22a.

Here, an effect when the etching resistant protection layer 30 is provided on the organic planarizing layer 13 or the organic pixel separation film 15 will be described with appropriate reference to the drawings.

Figure 4A:
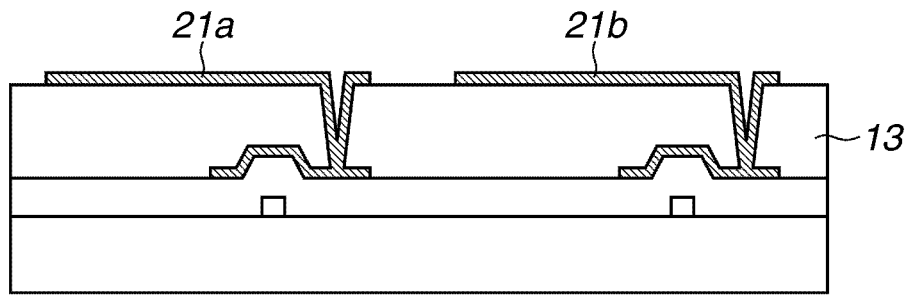
FIGS. 4A, 4B, and 4C are cross-sectional schematic views illustrating an appearance when the first organic compound layer is processed without providing the etching resistant protection layer.
Figure 4B:
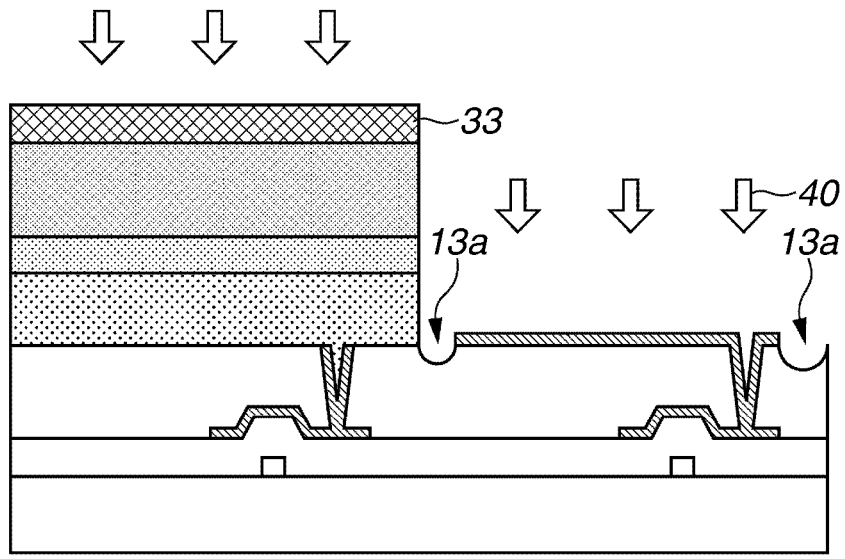
Figure 4C:
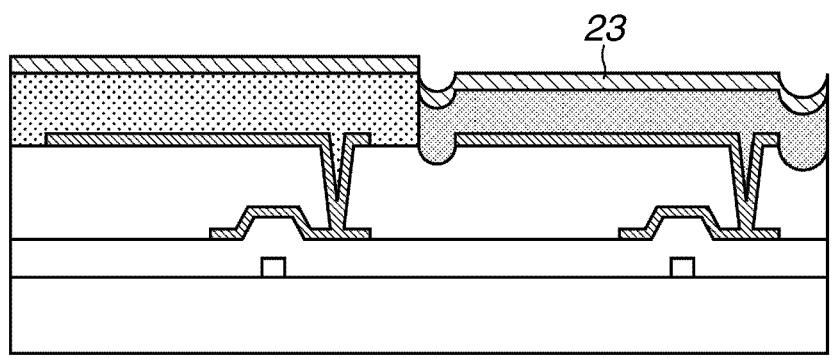

FIGS. 4A, 4B, and 4C are cross-sectional schematic views illustrating an appearance of processing the first organic compound layer without providing the etching resistant protection layer. FIGS. 4A, 4B, and 4C also illustrate comparative embodiments to the exemplary embodiments illustrated in FIGS. 1A, 1B, and 1C, and FIGS. 2A, 2B, and 2C.

As illustrated in FIG. 4A, when the etching resistant protection layer 30 is not provided on the organic planarizing layer 13 that composes the substrate 10, if the dry etching is performed as with FIG. 1C, the organic compound layer 22a provided in the region to be etched is etched. If the over-etching is performed as described above, the organic planarizing layer 13 provided in the region to be etched is also etched. As a result, a depression 13a occurs in the organic planarizing layer 13 by etching as illustrated in FIG. 4B, and the excessive unevenness in the organic planarizing layer 13 occurs due to this depression 13a. As a result, as illustrated in FIG. 4C, at the time when the common electrode (upper electrode 23) is formed, the second organic compound layer 22b and the common electrode are discontinued and their film thickness is thinned. When the second organic compound layer 22b and the common electrode are discontinued and their film thickness is thinned, current supply failure and defects such as leakage and short circuit are caused.

On the contrary, in the present exemplary embodiment, the etching resistant protection layer 30 is provided on the organic planarizing layer 13 or the organic pixel separation film 15. This can avoid the organic planarizing layer 13 and the organic pixel separation film 15 provided between the mutually nearby lower electrodes (21a, 21b) from being etched when the first organic compound layer is dry-etched. The etching rate of the etching resistant protection layer 30 is smaller than that of the first organic compound layer 22a. Thus, even if parts of the etching resistant protection layer 30 are etched by the over-etching, the unevenness produced by this etching is very small. Thus, when the second organic compound layer 22b and the upper electrode 23 that is the common electrode are formed in the subsequent steps, it can be excluded that the current is hardly supplied and the defects such as leakage and short circuit occur.

(Step of Forming Second Organic Compound Layer)

A film of a second organic compound layer 22b is formed in the region where the first organic compound layer 22a has been removed using the photolithographic step and the dry etching step in combination as described above (FIG. 2A). This enables to form the organic compound layers (22a, 22b) emitting the different emission color on the first lower electrode 21a and the second lower electrode 21b. Thus, it becomes possible to pattern the organic compound layer. When the film of the second organic compound layer 22b is formed, the second organic compound layer 22b may be formed on the first organic compound layer 22a as illustrated in FIG. 2A. When the second organic compound layer is formed, advantageously the following steps (2a) and (2b) are carried out after carrying out the above steps (1a) to (1h) for processing the first organic compound layer:

(2a) a step of forming the second organic compound layer on the second lower electrode, and (2b) a step of removing at least the protection layer formed on the first lower electrode together with the second organic layer formed on the protection layer by immersing these layers in a solvent in which the release layer is soluble.

When three or more types of pixels are included in the organic light-emitting device to be made, the step of processing the organic compound layer and the step of forming the other organic compound layer are appropriately added depending on the type of the pixel. Basically, the step of processing the organic compound layer is the same as the step of processing the first organic compound layer described above. The step of forming the other organic compound layer is basically the same as the step of forming the second organic compound layer described above. The organic compound layer having the desired emission color can be patterned by thus repeating the step of processing the organic compound layer and the step of forming the other organic compound layer. For example, a full-color organic light-emitting device can be made using three types of pixels having emission colors, blue, green, and red, respectively.

(Step of Removing Protection Layer and Release Layer)

Subsequently, the substrate 10 is immersed in a solution in which the release layer 31 is selectively dissolved to dissolve the release layer 31 and lift off the protection layer 32 (FIG. 2B). When the release layer 31 is lifted off, the penetration of the solution and the release of the protection layer may be facilitated using ultrasound and binary fluid. The organic compound layer can be patterned as illustrated in FIG. 2B by removing the protection layer 32 and the release layer 31 as described above.

The method of removing the protection layer 32 and the release layer 31 is not limited to the aforementioned method for removal by lift-off. For example, the protection layer 32 and the release layer 31 can be removed sequentially by the dry etching after generally completing the step of processing the organic compound layer.

In the exemplary embodiment described above, the substrate is exposed to water when the water-soluble polymer material is formed and when the lift-off is conducted in the photolithographic step in the patterning of the organic compound layer, but in the present exemplary embodiment, the penetration of water can be prevented because the organic planarizing layer is covered with the lower electrode and the etching resistance protection layer.

(Step of Forming Common Layer and Common Electrode)

The upper electrode 23 that is the common electrode is formed after generally completing the patterning of the organic compound layer by the steps described above (FIG. 2C). The common electrode (upper electrode 23) is a transparent electrode or a reflective electrode in consideration of a direction for taking the light emitted from the organic compound layer (22a, 22b). When the upper electrode 23 is the transparent electrode, transparent conductive materials such as indium tin oxide and indium zinc oxide can be used as the constituent material thereof. Meanwhile, when the upper electrode 23 is the reflective electrode, a metal single body such as Ag and Al having a high light reflectivity and an alloy containing a plurality of metal single bodies can be used. A vapor deposition method or a sputtering method is generally used as the method of forming the upper electrode 23 that is the common electrode.

Before forming the upper electrode 23, the common layers such as the electron injection layer may be formed. When the electron injection layer is formed, the electron injection layer is formed by the method shown in the following (a) or (b):

(a) a method of forming a monolayer thin film of about 0.5 nm to 5 nm from an alkaline metal, an alkaline earth metal, or a compound thereof, or (b) a method of co-vapor-depositing the alkaline metal, the alkaline earth metal, or the compound thereof with an organic material (organic material that is an electron injection material).

The alkaline metal, the alkaline earth metal, or the compound thereof used as the constituent material for the electron injection layer may be contained directly in the upper electrode 23. In such a case, when the upper electrode 23 is formed, a cathode material such as Ag and a metal material such as Mg having a low work index are co-vapor-deposited to form an electrode thin film that is the upper electrode 23.

(Sealing Step)

After forming the upper electrode 23, the organic light-emitting device itself is sealed in order to prevent oxygen and water in air from penetrating into the organic light-emitting device. This completes the organic light-emitting device. In the present exemplary embodiment, a specific method for sealing is not particularly limited, and the organic light-emitting device may be sealed using a hygroscopic agent and a glass cap, and when a silicon nitride (SiN) film is used for a moisture-proof layer, the film thickening the moisture-proof layer to about 1 μm to 10 μm may be used as a sealing film.

(Organic Light-Emitting Device)

The organic light-emitting device 1 manufactured by the method for manufacture of the present exemplary embodiment is, for example, an organic light-emitting device having two types of pixels, i.e., a first pixel 2a and a second pixel 2b as illustrated in FIG. 2C. The first pixel 2a is composed of the first lower electrode 21a, the first organic compound layer 22a having at least the light-emitting layer, and the first upper electrode. On the other hand, the second pixel 2b is composed of the second lower electrode 21b, the first organic compound layer 22b having at least the light-emitting layer, and the second upper electrode. Here, the first upper electrode and the second upper electrode are parts of the common electrode layer that is common to all pixels provided on the substrate, i.e., parts of the upper electrode 23 illustrated in FIG. 2C.

In the organic light-emitting device 1 in FIG. 2C, a plane region of the first pixel 2a refers to a whole area of the first lower electrode 21a including a contact hole 16a. Also in the organic light-emitting device 1 in FIG. 2C, a plane region of the second pixel 2b refers to a whole area of the second lower electrode 21b including a contact hole 16b. Meanwhile, when the etching resistant protection layer 30 is provided on the lower electrodes (21a, 21b) as illustrated in FIGS. 3B and 3C, the plane region of each pixel (2a, 2b) is defined as follows. More specifically, the region not covered with the etching resistant protection layer 30 among the plane region provided with the lower electrodes (21a, 21b) included in each pixel (2a, 2b) is the plane region of the pixel.

In the organic light-emitting device 1 illustrated in FIG. 2C, the first pixel 2a and the second pixel 2b are provided one by one on the substrate 10. However, a plurality of pixels, at least a plurality of at least the first pixels and the second pixels are provided on the substrate in the organic light-emitting device manufactured by the method for manufacture of the present exemplary embodiment. The type of the pixel is not particularly limited in the present exemplary embodiment.

The present invention will be described below with reference to Examples, but the present invention is not limited thereto.

Example 1

An organic light-emitting device having three types of pixels was made by a process described below. FIGS. 5A, 5B, 5C, 5D, 5E, 5F, 5G, 5H, 5I, 5J, 5K, 5L, and 5M are cross-sectional schematic views illustrating the process of manufacturing the organic light-emitting device in the present Example.

(1) Substrate

Figure 5A:
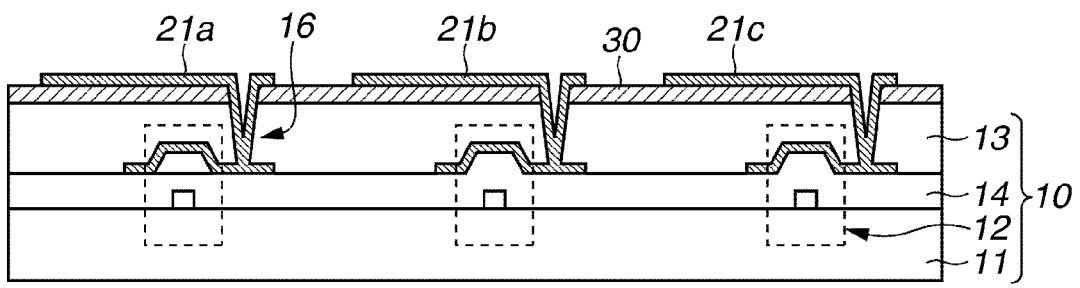
FIGS. 5A, 5B, 5C, 5D, 5E, 5F, 5G, 5H, 5I, 5J, 5K, 5L, and 5M are cross-sectional schematic views illustrating a process of manufacturing an organic light-emitting device in Example 1.

The organic light-emitting device was made using a substrate 10 in which a pixel driving circuit 12 composed of TFT and a wiring and an organic planarizing film 13 were sequentially provided on a glass substrate (base 11). As illustrated in FIG. 5A, an insulation layer 14 is included in addition to the base 11, the pixel driving circuit 12 and the organic planarizing layer 13 in the substrate 10 used in present Example.

(2) Step of Forming Etching Resistant Protection Layer

First, the organic planarizing film 13 was formed on the glass substrate on which the pixel driving circuit 12 composed of a transistor and the wiring was sequentially provided. Photosensitive polyimide was used for the organic planarizing layer 13. This substrate 10 was heated in vacuum at 250° C. for 2 hours, and subsequently a film of SiN was formed at temperature of 100° C. on the organic planarizing layer 13 to form an etching resistant protection layer 30 so that the organic planarizing layer 13 was entirely covered. At that time, a film thickness of the etching resistant protection layer was 1000 nm.

Subsequently, a contact hole 16 was formed in a predetermined region in the etching resistant protection layer 30 and the organic planarizing layer 13 utilizing a photolithographic process. This contact hole 16 is provided to electrically connect the pixel driving circuit 12 to lower electrodes (21a, 21b, 21c).

(3) Step of Forming Lower Electrodes

After forming the contact hole 16, vacuum heating at 150° C. for 30 minutes under a vacuum environment higher than $1\times10^{-3}$ Pa was performed to remove water when the contact hole 16 was formed. Subsequently, an Ag film and an indium zinc oxide film were laminated in this order on the etching resistant protection layer 30 to form a laminated thin film. The film thickness of the Ag film was 100 nm and the film thickness of the indium zinc oxide film was 20 nm. Subsequently, a first lower electrode 21a, a second lower electrode 21b, and a third lower electrode 21c were formed in predetermined regions, respectively, by patterning utilizing the photolithographic process (FIG. 5A). The first lower electrode 21a, the second lower electrode 21b, and the third lower electrode 21c work as an anode. At that time, the organic planarizing layer 13 was entirely covered with the etching resistant protection layer 30, the first lower electrode 21a, the second lower electrode 21b, and the third lower electrode 21c.

Subsequently, the substrate on which the lower electrodes (first lower electrode 21a, second lower electrode 21b, and third lower electrode 21c) had been formed was introduced into a vacuum film forming apparatus. Then, a dehydration treatment was performed by baking in vacuum at 120° C. for 5 minutes in the vacuum film forming apparatus, and the surface of the lower electrodes was cleaned by introducing dry air into the vacuum film forming apparatus to treat with UV ozone for 10 minutes.

(4) Step of Forming First Organic Compound Layer

Figure 5B:
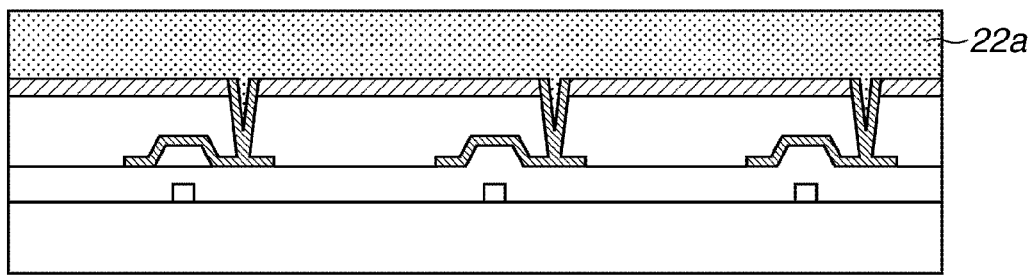

After cleaning the substrate 10, a first organic compound layer 22a in which a hole transport layer, a red light-emitting layer, and an electron transport layer were laminated in this order was formed throughout the display region (FIG. 5B). At that time, a total film thickness of the first organic compound layer 22a was 250 nm.

(5) Step of Forming Release Layer

Subsequently, polyvinyl pyrrolidone (PVP) was dissolved in pure water at a final concentration of 5% by weight to prepare an aqueous PVP solution.

Figure 5C:
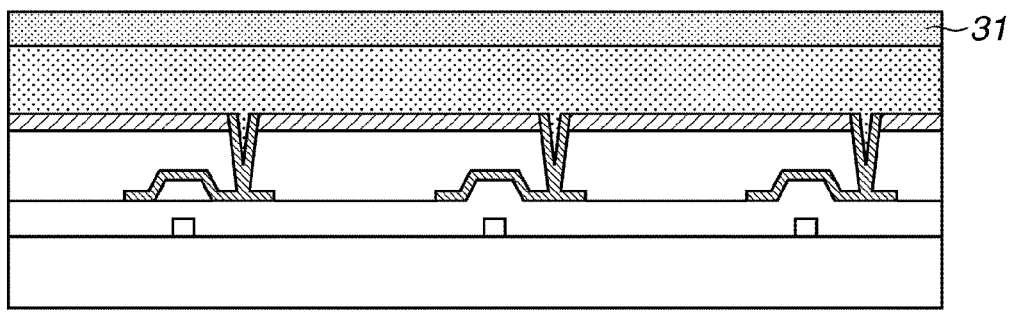

Subsequently, the previously prepared aqueous PVP solution was entirely applied onto the first organic compound layer 22a to form a PVP thin film. Then, this PVP thin film was treated with heat at 100° C. for 10 minutes to form a release layer 31 (FIG. 5C). At that time, the film thickness of the release layer 31 was about 0.5 μm.

(6) Step of Forming Protection Layer

Figure 5D:
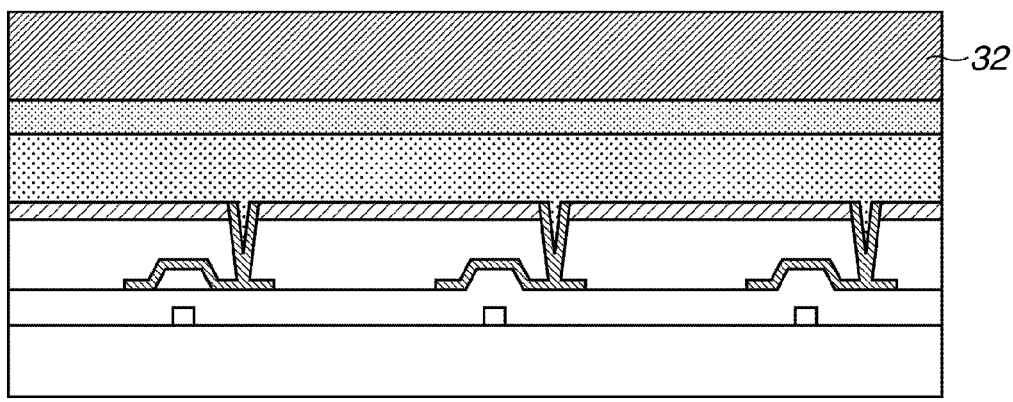

Subsequently, after introducing the substrate on which the release layer 31 was formed into a CVD film forming apparatus, a film of silicon nitride (SiN) was formed to form a protection layer 32 (FIG. 5D). At that time, the film thickness of the protection layer 32 was 2 μm.

(7) Step of Forming Resist Layer

Figure 5E:
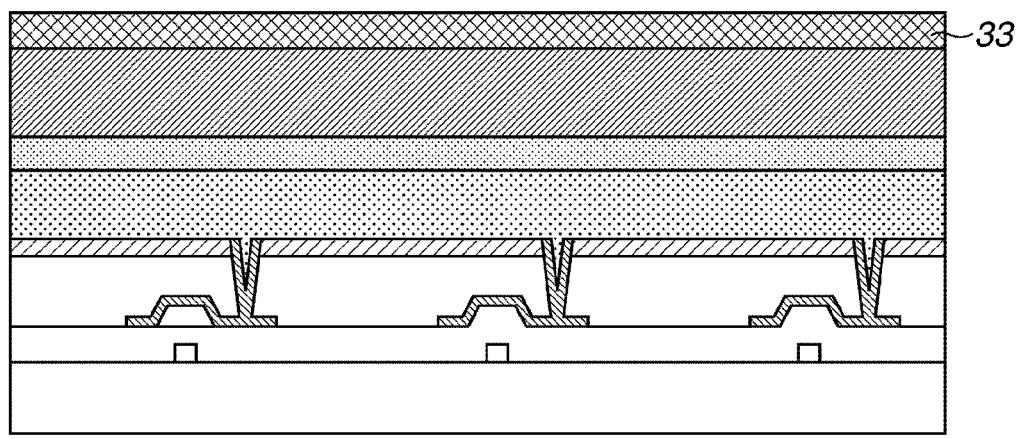

Subsequently, a solution containing a resist material was applied onto the protection layer 32 by a spin coating method, and heated at 120° C. for 10 minutes to form a resist layer 33 (FIG. 5E). At that time, the film thickness of the resist layer 33 was 1 μm.

(8) Step of Exposure/Development

Subsequently, the substrate was set in an MPA (exposure apparatus), and exposure was conducted using a predetermined light shielding mask so that a resist is left in a predetermined region on the desired lower electrodes. Subsequently, development was conducted using a developer (brand name: NMD-3, manufactured by Tokyo Ohka Kogyo), and then, the resist provided in a region other than a region where the resist was to be left was removed by washing with water.

(9) Step of Processing First Organic Compound Layer

Figure 5F:
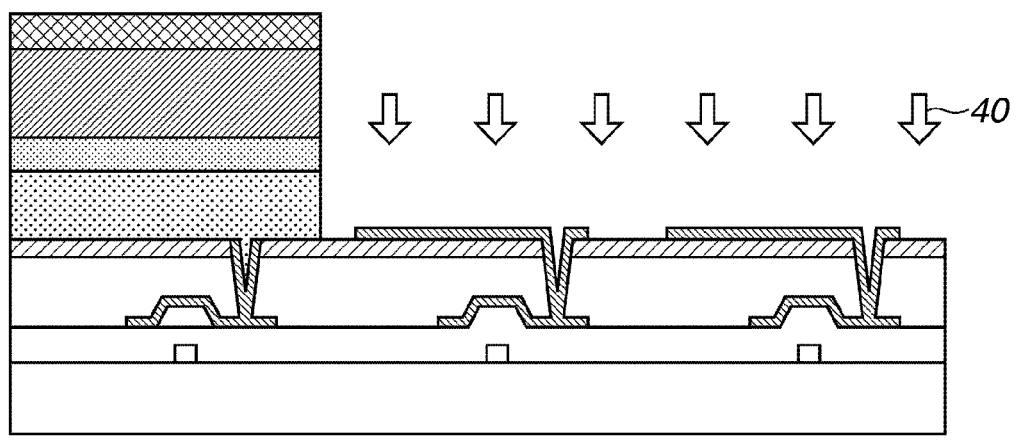

Subsequently, after placing the substrate 10 into a dry etching apparatus, the protection layer 32 provided in a region where the resist layer 33 had been removed was removed by etching using CF$_4$ plasma (dry etching). Subsequently, the release layer 31 and the first organic compound layer 22a provided in the region where the resist layer 33 had been removed were removed sequentially by etching using oxygen plasma (FIG. 5F). Upon etching, an actual etching time was a time period increased by 20% from an etching time theoretically calculated from the film thickness and an etching rate of the release layer 31 and the first organic compound layer 22a. When the actual etching time was calculated, the etching time was calculated by setting that the film thickness of the release layer 31 and the first organic compound layer 22a was 0.5 µm and 250 nm, respectively.

An unevenness of an etching edge after processing the first organic compound layer 22a by the etching was a sum of the film thickness of the release layer 31 and the film thickness of the first organic compound 22a. Thus, it was found that the etching resistant protection layer 30 was scarcely etched in the step of processing the first organic compound layer 22a.

(10) Step of Forming Second Organic Compound Layer

Figure 5G:
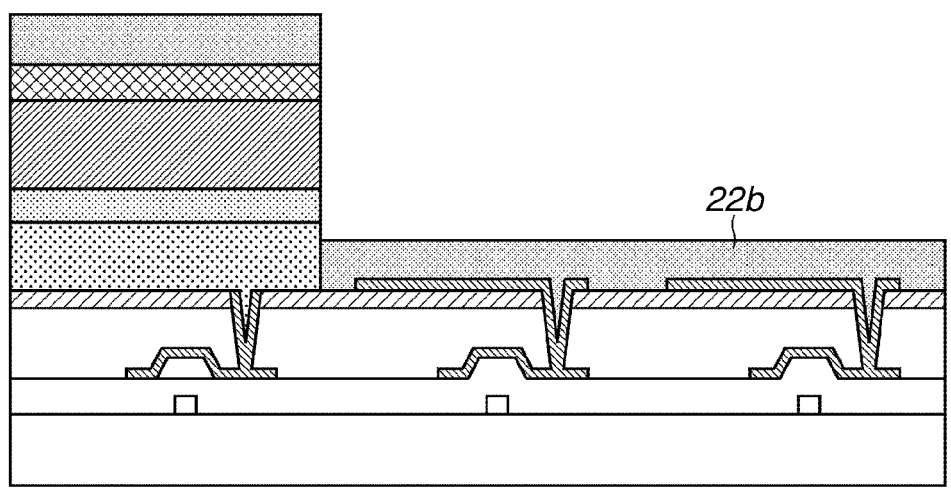

Subsequently, after completing the processing of the first organic compound layer, the substrate 10 having the first organic compound layer 22a formed in a desired pattern was introduced into the vacuum film forming apparatus. Then, a second organic compound layer 22b in which a hole injection layer, a hole transport layer, a green light-emitting layer, and an electron transport layer were laminated in this order was formed at least on the second lower electrode 21b (FIG. 5G). At that time, the film thickness of the second organic compound layer 22b was 200 nm.

(11) Step of Processing Second Organic Compound Layer

Figure 5H:
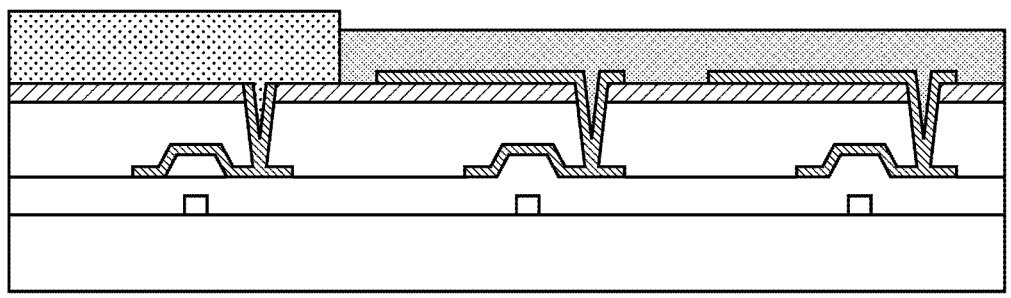

Subsequently, the substrate 10 was immersed in a glass container in which pure water had been added, and the PVP thin film was dissolved using an ultrasonic vibrator to release the protection layer 32 (SiN film), as well as release and remove the second organic compound layer 22b formed on the protection layer 32 together with the release layer 31 and the protection layer 32 (FIG. 5H).

Figure 5I:
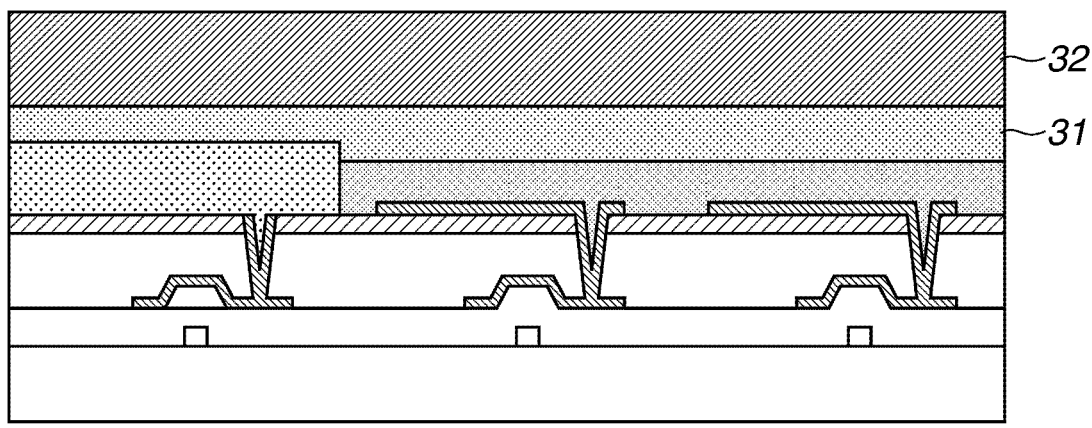
Figure 5J:
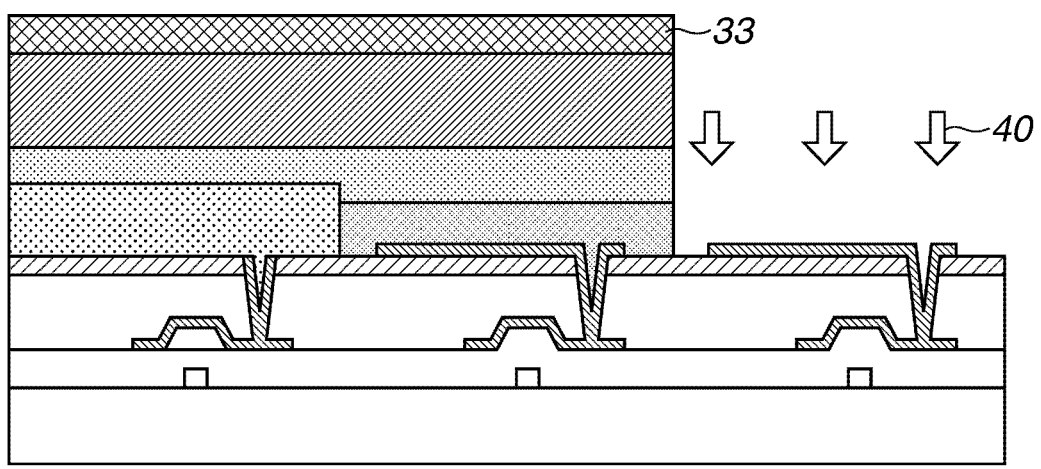

Subsequently, films of a release layer 31 (PVP) and a protection layer 32 (SiN film) were sequentially formed in the same manner as in the step of processing the first organic compound layer 22a (FIG. 5I). Then, the protection layer 32, the release layer 31, and the second organic compound layer 22b formed on the third lower electrode 21c were removed using the photolithographic method and the dry etching (FIG. 5J).

At that time, a time period for conducting the dry etching was the etching time increased by 20% from the etching time theoretically calculated from the film thickness and the etching rate of the release layer 31 and the second organic compound layer 22b, as was the case with processing of the first organic compound layer 22a.

The unevenness of the etching edge after processing the second organic compound layer 22b by the etching was the sum of the film thickness of the release layer 31 and the film thickness of the second organic compound 22b. Thus, it was found that the etching resistant protection layer 30 was scarcely etched in the step of processing the second organic compound layer 22b.

(12) Step of Forming Third Organic Compound Layer

Figure 5K:
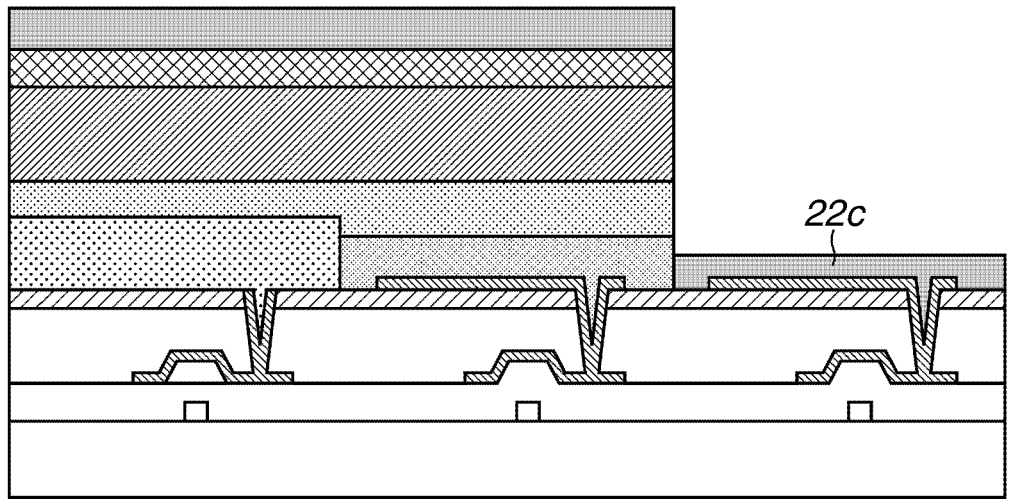

Subsequently, after completing the processing of the second organic compound layer, the substrate 10 having the second organic compound layer 22b formed in the desired pattern was introduced into the vacuum film forming apparatus. Then, a third organic compound layer 22c in which a hole injection layer, a hole transport layer, a blue light-emitting layer, and an electron transport layer were laminated in this order was formed at least on the third lower electrode (not shown in the figure) (FIG. 5K). At that time, the total film thickness of the third organic compound layer 22c was 140 nm.

(13) Step of Processing Third Organic Compound Layer

Figure 5L:
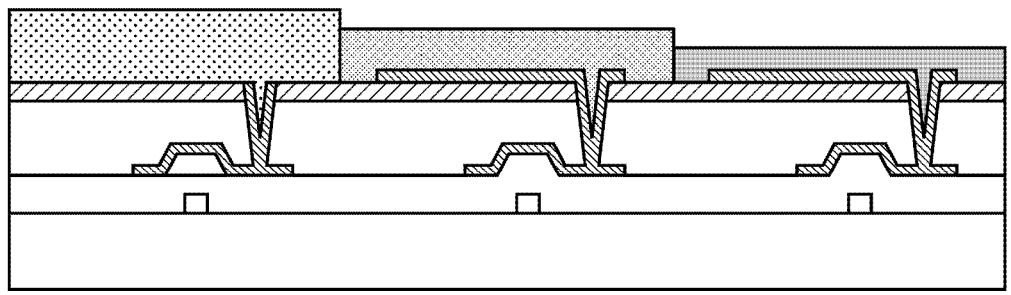

Subsequently, the substrate 10 was immersed in the glass container in which pure water had been added, and the PVP thin film was dissolved using the ultrasonic vibrator to release the protection layer 32 (SiN film), as well as release and remove the third organic compound layer 22c formed on the protection layer 32 together with the release layer 31 and the protection layer 32. This exposed the surfaces of the first organic compound layer 22a, the second organic compound layer 22b, and the third organic compound layer 22c (FIG. 5L).

Step of Forming Common Layer

Subsequently, the substrate 10 on which three types of the organic compound layers had been provided was introduced into vacuum, treated with heat at 100° C. for 30 minutes, the heat was sufficiently released, and then films of an electron transport layer (not shown in the figure) and an electron injection layer (not shown in the figure) were formed sequentially.

(15) Step of Forming Upper Electrode

Figure 5M:
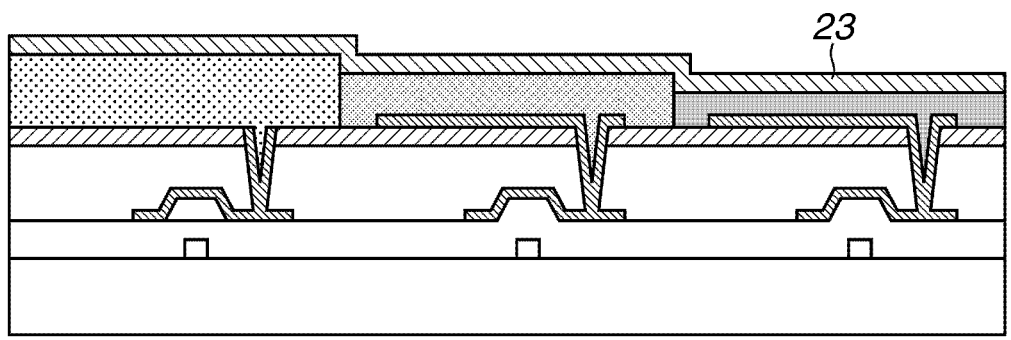

Subsequently, a film of Ag was formed on the electron injection layer by the sputtering method to form an upper electrode 23 (FIG. 5M). At that time, the film thickness of the upper electrode 12 was 12 nm.

(16) Step of Sealing

Finally, an SiN film was formed on the substrate 10 by CVD film formation to seal the organic light-emitting device. At that time, the film thickness of the SiN film was 6 µm.

The organic light-emitting device was obtained as described above.

(17) Evaluation of Organic Light-Emitting Device

For the obtained organic light-emitting device, direct current was applied to emit the light, and a light-emitting property that was even in plane was confirmed.

Example 2

An organic light-emitting device was made in the same manner as in Example 1, except that the substrate illustrated in FIG. 3B was used in place of the substrate illustrated in FIG. 1A. The present Example will be described below in respects that are different from Example 1.

(Step of Making Lower Electrodes)

First, the same substrate as the substrate 10 described in Example 1 (1) was prepared. Subsequently, the first lower electrode 21a, the second lower electrode 22b, and the third lower electrode (not shown in the figure) were formed in the desired pattern on the organic planarizing film in the same manner as in Example 1 (3).

(Step of Making Organic Pixel Separation Film)

Subsequently, a photosensitive polyimide film was formed by applying a solution containing photosensitive polyimide and drying the coated film. At that time, the film thickness of the photosensitive polyimide film was 2 µm. Subsequently, the photosensitive polyimide film was exposed and developed to form an organic pixel separation film 15 provided with a desired sized opening on each lower electrode.

(Step of Forming Etching Resistant Protection Layer)

After making the substrate with the organic pixel separation film, which was then baked in vacuum at 250° C. for 2 hours, subsequently a silicon oxide (SiO$_2$) film was formed on this substrate with the organic pixel separation film in such a way as to entirely cover the organic pixel separation film and the organic planarizing layer. At that time, the film thickness of the SiO$_2$ film was 100 nm. Then, an etching resistant protection layer 30 was formed in a region provided with the organic pixel separation film by patterning this SiO$_2$ film according to the shape of the organic pixel separation film. When the etching was conducted under the same condition as in Example 1 in the step of processing the organic compound layer in the present Example, the etching resistant protection layer 30 formed in the present Example was not etched.

(Evaluation of Organic Light-Emitting Device)

For the obtained organic light-emitting device, direct current was applied to emit the light as was the case with Example 1, and the light-emitting property that was even in plane was confirmed.

Comparative Example 1

An organic light-emitting device was made in the same manner as in Example 1, except that the substrate illustrated in FIG. 4A was used in place of the substrate illustrated in FIG. 1A. More specifically, in the present Comparative Example 1, the organic light-emitting device was made in the same manner as in Example 1, except that the step of forming the etching resistant protection layer in Example 1 (2) was omitted.

When the etching was conducted under the same condition as in Example 1 in the step of processing the organic compound layer in the present Comparative Example, a portion of the organic planarizing layer 12 included in the substrate 10, specifically the organic planarizing layer 13 present in the region of processing the organic compound layer was etched. Here, the unevenness produced in the etching edge by the etching was 160 μm when the first organic compound layer 22a was etched, and 320 μm when the second organic compound layer 22b was etched (Evaluation of Organic Light-Emitting Device)

For the obtained organic light-emitting device, direct current was applied to emit the light as was the case with Example 1, and it was confirmed that there were sometimes non-light-emitting pixels and brightness began to deteriorate from the periphery of light-emitting pixels.

A cross-section of the non-light-emitting pixel present in the organic light-emitting device of the present Comparative Example was observed on an SEM, and the unevenness occurred in the portion of the etched organic planarizing film as illustrated in FIG. 4C, and the common electrode was broken in this portion having the unevenness. The lower electrode was also confirmed to come into contact with the upper electrode to cause short circuit.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Applications No. 2011-217662 filed Sep. 30, 2011 and No. 2012-191771 filed Aug. 31, 2012, which are hereby incorporated by reference herein in their entirety.

What is claimed is:

1. A method for manufacturing an organic light-emitting device,
    wherein a plurality of first pixels and a plurality of second pixels are provided respectively on a substrate including an organic planarizing layer,
    wherein the first pixel includes a first lower electrode, a first organic compound layer including at least a light-emitting layer, and a first upper electrode,
    wherein the second pixel includes a second lower electrode, a second organic compound layer including at least a light-emitting layer, and a second upper electrode, and
    wherein the first upper electrode and the second upper electrode are common electrodes that are common to all pixels provided on the substrate, the method comprising:
    a step of preparing the substrate provided with the organic planarizing layer;
    a step of forming the lower electrodes wherein the first lower electrode and the second lower electrode are formed;
    a step of forming the first organic compound layer in such a way as to cover the first lower electrode and the second lower electrode;
    a step of forming of a release layer wherein the release layer soluble in pure water is formed on the first organic compound layer;
    a step of forming a protection layer composed of an inorganic material, which is formed on the release layer;
    a step of forming a resist layer wherein a film of a resist material is formed on the protection layer;
    a step of processing the resist layer wherein the resist layer is patterned so as to leave the resist layer formed in a region in which the first pixel is provided;
    a step of removing the protection layer, the release layer, and the first organic compound layer in a region where the resist layer is removed in the step of processing the resist layer, by the dry etching; and
    a step of forming the second organic compound layer on the second lower electrode, and
    the method further comprising:
    a step of forming an etching resistant protection layer wherein the etching resistant protection layer is provided before the step of forming the first organic compound layer so that the organic planarizing layer is covered with at least one of the lower electrode and the etching resistant protection layer,
    wherein an etching rate of the etching resistant protection layer is slower than that of the first organic compound layer in the step of removing the first organic compound layer.

2. The method according to claim 1, wherein the method comprises the step of forming the etching resistant protection layer between the step of forming the lower electrode and the step of forming the first organic compound layer, and
    wherein the etching resistant protection layer covers edges of the first lower electrode and the second lower electrode in the step of forming the etching resistant protection layer.

3. The method according to claim 1, wherein the etching resistant protection layer is a layer composed of an inorganic material.

4. A method for manufacturing an organic light-emitting device,
    wherein a plurality of pixels are provided respectively on a substrate including an organic planarizing layer,
    wherein the pixel includes a lower electrode, an organic compound layer including at least a light-emitting layer, and an upper electrode, and
    wherein the upper electrode is a common electrode that is common to the plurality of pixels provided on the substrate,
    the method comprising:
    a step of preparing the substrate provided with the organic planarizing layer and the lower electrodes;

a step of forming the organic compound layer in such a way as to cover the lower electrodes;

a step of forming of a release layer wherein the release layer soluble in pure water is formed on the organic compound layer;

a step of forming a protection layer composed of an inorganic material, which is formed on the release layer;

a step of forming a resist layer wherein a film of a resist material is formed on the protection layer;

a step of processing the resist layer wherein the resist layer is patterned so as to leave the resist layer formed in a region where the organic compound layer is left;

a step of removing the protection layer, the release layer, and the organic compound layer in a region in which the resist layer is removed in the step of processing the resist layer, by the dry etching; and the method further comprising:

a step of forming an etching resistant protection layer wherein the etching resistant protection layer is provided before the step of forming the organic compound layer so that the organic planarizing layer is covered with at least one of the lower electrode and the etching resistant protection layer, wherein an etching rate of the etching resistant protection layer is slower than that of the organic compound layer in the step of removing the organic compound layer.

5. The method according to claim 4, wherein the method comprises the step of forming the etching resistant protection layer between the step of forming the lower electrode and the step of forming the organic compound layer, and wherein the etching resistant protection layer covers edges of the lower electrode in the step of forming the etching resistant protection layer.

6. The method according to claim 4, wherein the etching resistant protection layer is a layer composed of an inorganic material.

7. The method according to claim 6, wherein the etching resistant protection layer is a silicon nitride film or a silicon oxide nitride film.

8. The method according to claim 4, in the step of removing the protection layer and the release layer, the release layer is contacted to and dissolved in a solution including water to lift off the protection layer.

9. The method according to claim 4, further comprising a step of forming the upper electrode after the step of removing the protection layer and the release layer.

10. The method according to claim 4, wherein the release layer contains one or more kinds selected from the group consisting of polyvinyl alcohol, polyacrylic acid-based polymers, polyethylene glycol, polyethylene oxide, and polyvinyl pyrrolidone.

11. The method according to claim 4, wherein the protection layer is a silicon nitride film or a silicon oxide nitride film.

* * * * *